(12) United States Patent
Wu (10) Patent No.: US 12,135,343 B2
(45) Date of Patent: Nov. 5, 2024

(54) ABNORMAL CURRENT MONITORING DEVICE AND ABNORMAL CURRENT MONITORING METHOD

(71) Applicant: Industrial Technology Research Institute, Hsinchu (TW)

(72) Inventor: Chih-Chiang Wu, Keelung (TW)

(73) Assignee: Industrial Technology Research Institute, Hsinchu (TW)

( * ) Notice: Subject to any disclaimer, the term of this patent is extended or adjusted under 35 U.S.C. 154(b) by 134 days.

(21) Appl. No.: 18/088,773

(22) Filed: Dec. 27, 2022

(65) Prior Publication Data
US 2024/0210450 A1 Jun. 27, 2024

(51) Int. Cl.
*G01R 19/165* (2006.01)
*G01R 19/32* (2006.01)

(52) U.S. Cl.
CPC ....... *G01R 19/16571* (2013.01); *G01R 19/32* (2013.01)

(58) Field of Classification Search
CPC ............... G01R 19/16571; G01R 19/32
USPC .......................................... 340/664
See application file for complete search history.

(56) References Cited

U.S. PATENT DOCUMENTS

| | | | |
|---|---|---|---|
| 8,675,320 B2 | 3/2014 | Chang et al. | |
| 12,013,425 B2* | 6/2024 | Cho | G01R 31/58 |
| 2008/0002325 A1* | 1/2008 | Kato | H03K 3/00 361/100 |
| 2013/0090869 A1 | 4/2013 | Ewing et al. | |
| 2014/0167669 A1* | 6/2014 | Lim | B60L 3/0061 324/750.02 |
| 2014/0218008 A1 | 8/2014 | Ewing et al. | |
| 2021/0098982 A1* | 4/2021 | Li | G01R 31/52 |

FOREIGN PATENT DOCUMENTS

| | | |
|---|---|---|
| CN | 108957278 | 12/2018 |
| CN | 105977905 | 1/2019 |
| CN | 110635792 | 12/2019 |

(Continued)

OTHER PUBLICATIONS

"Office Action of Taiwan Counterpart Application", issued on Aug. 14, 2023, p. 1-p. 3.

(Continued)

*Primary Examiner* — Kerri L McNally
(74) *Attorney, Agent, or Firm* — JCIPRNET (57) ABSTRACT

The disclosure provides an abnormal current monitoring device and an abnormal current monitoring method. The abnormal current monitoring device includes a first detection circuit which detects a first electrical parameter of a power device based on an i-th level short circuit time, a second detection circuit which detects a second electrical parameter of the power device to generate an i-th level detection signal based on the i-th level short circuit time, and a control circuit which generates an i-th level heat estimation value to determine whether the power device is damaged according to the first electrical parameter, and determines whether the power device is abnormal in operation according to the i-th level detection signal, so as to record the i-th level heat estimation value and the i-th level short circuit time, or adjust the i-th level short circuit time to an i+1-th level short circuit time.

20 Claims, 5 Drawing Sheets

(56) References Cited

FOREIGN PATENT DOCUMENTS

| CN | 111585553 | 8/2020 |
|---|---|---|
| CN | 114428216 | 5/2022 |
| CN | 110854802 | 6/2022 |
| TW | I627421 | 6/2018 |
| TW | 202024821 | 7/2020 |
| WO | 2010151835 | 12/2010 |

OTHER PUBLICATIONS

Paula Diaz Reigosa et al., "A Short Circuit Safe Operation Area Identification Criterion for SiC MOSFET Power Modules", IEEE Transactions on Industry Applications, Jun. 2017, pp. 1-11.

Feyzullah Erturk et al., "Real-Time Aging Detection of SiC MOSFETs", IEEE Transactions on Industry Applications, vol. 55, No. 1, Jan.-Feb. 2019, pp. 600-609.

Takeshi Horiguchi et al., "A Fast Short-Circuit Protection Method Using Gate Charge Characteristics of SiC MOSFETs", 2015 IEEE Energy Conversion Congress and Exposition (ECCE), Sep. 20-24, 2015, pp. 4759-4764.

Shan Yin et al., "A digital-controlled gate charge detection circuit for short-circuit protection and condition monitoring of SiC MOSFET", IET Power Electronics, Jan. 13, 2022, pp. 476-486.

Patrick Wang et al., "Condition Monitoring of SiC MOSFETs Utilizing Gate Leakage Current", 2020 IEEE Applied Power Electronics Conference and Exposition (APEC), Mar. 15-19, 2020, pp. 1837-1843.

Slavko Mocevic et al., "Comparison and Discussion on Shortcircuit Protections for Silicon-Carbide MOSFET Modules: Desaturation Versus Rogowski Switch-Current Sensor", IEEE Transactions on Industry Applications, vol. 56, No. 3, May-Jun. 2020, pp. 2880-2893.

* cited by examiner

ABNORMAL CURRENT MONITORING DEVICE AND ABNORMAL CURRENT MONITORING METHOD

TECHNICAL FIELD

The disclosure relates to an electronic device, and in particular, to an abnormal current monitoring device and an abnormal current monitoring method.

BACKGROUND

To meet the needs of electronic products with different needs, the products may use various materials to manufacture power devices. In order to meet the demand for miniaturization, the size of the power device is getting smaller and smaller, and the response time of the power device enough to withstand the instantaneous over current is shortened. Within the preset response time, when the energy of the over current is too large, the power device may be slightly damaged and the oxide layer therein may be destroyed. At this time, although the power device is operable, the power device may generate leakage current and affect the output power. On the other hand, when the energy of the over current is even larger, the power device may be severely damaged and inoperable.

Generally speaking, the over current detection and protection circuit may detect the over current to protect the power device from being severely damaged. However, the over current detection and protection circuit may not know the damage of the power device, so that the problem of electrical abnormality may not be eliminated.

SUMMARY

The embodiment of the disclosure provides an abnormal current monitoring device capable of monitoring the electrical abnormality of the over current and the health of the power device so as to eliminate the problem of the electrical abnormality caused by leakage currents.

An abnormal current monitoring device of the embodiment of the disclosure is suitable for a power device. The abnormal current monitoring device includes a first detection circuit coupled to the power device, a second detection circuit coupled to the power device, and a control circuit coupled to the first detection circuit and the second detection circuit. The first detection circuit is configured to detect a first electrical parameter of the power device based on an i-th level short circuit time. The second detection circuit is configured to detect a second electrical parameter of the power device to generate an i-th level detection signal based on the i-th level short circuit time. The control circuit is configured to generate an i-th level heat estimation value to determine whether the power device is damaged according to the first electrical parameter, and to determine whether the power device is abnormal in operation according to the i-th level detection signal. The control circuit records the i-th level heat estimation value and the i-th level short circuit time when the power device is determined to be damaged and abnormal in operation. The control circuit adjusts the i-th level short circuit time to be the i+1-th level short circuit time when the power device is determined to be non-damaged and not abnormal in operation, where i is a non-negative integer.

The embodiment of the disclosure also provides an abnormal current monitoring method. The abnormal current monitoring method is suitable for a power device, and includes the following steps. A first electrical parameter of the power device is detected through a first detection circuit based on an i-th level short circuit time. A second electrical parameter of the power device is detected to generate an i-th level detection signal through a second detection circuit based on the i-th level short circuit time. An i-th level heat estimation value is generated to determine whether the power device is damaged through a control circuit according to the first electrical parameter, and it is determined whether the power device is abnormal in operation according to the i-th level detection signal. The i-th level heat estimation value and the i-th level short circuit time are recorded through the control circuit when it is determined that the power device is damaged and is abnormal in operation. The i-th level short circuit time is adjusted to be the i+1-th level short circuit time through the control circuit when it is determined that the power device is non-damaged and not abnormal in operation, where i is a non-negative integer.

In order to make the above-mentioned features of the disclosure clearer and easier to understand, the following embodiments are given and described in details with the accompanying drawings as follows.

DETAILED DESCRIPTION OF DISCLOSED EMBODIMENTS

Parts of the embodiments of the disclosure may be described in detail with reference to the accompanying drawings. For the reference symbols referenced in the following description, the same reference symbols appearing in different drawings may be regarded as the same or similar components. The embodiments are only a part of the disclosure, and do not disclose all possible implementation modes of the disclosure. Rather, the embodiments are only examples within the scope of the patent application of the disclosure.

Figure 1:
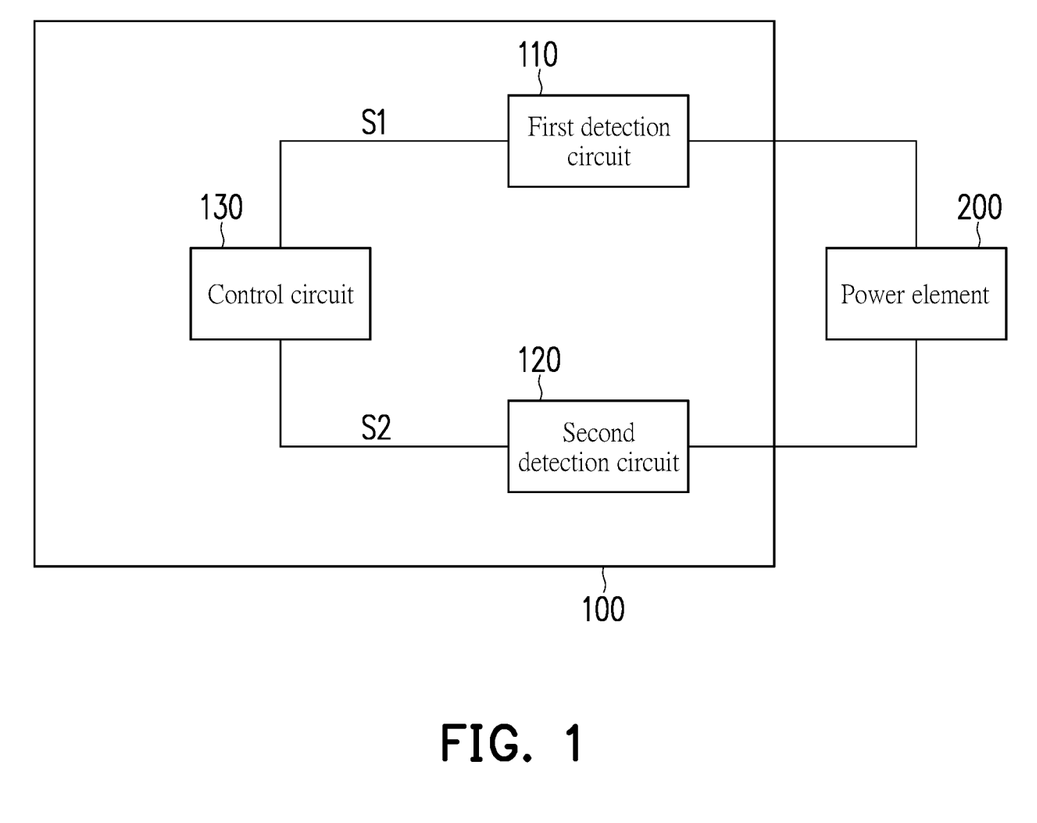
FIG. 1 is a block diagram of an abnormal current monitoring device according to an embodiment of the disclosure.

FIG. 1 is a block diagram of an abnormal current monitoring device according to an embodiment of the disclosure. Referring to FIG. 1, an abnormal current monitoring device 100 may be suitable for a power device 200 to monitor various electrical abnormalities of the power device 200. In the embodiment, the power device 200 may be, for example, a metal-oxide-semiconductor field-effect transistor (MOSFET), an insulated gate bipolar transistor (IGBT), or semiconductor components made of silicon carbide (SiC) or gallium nitride (GaN).

In the embodiment, the abnormal current monitoring device 100 and the power device 200 may be integrated into the same chip. The aforementioned chip may be, for example, a system on chip (SOC), which may include a processor such as a microcontroller, microprocessor, and a digital signal processor (such as a control circuit 130), as well as a read-only memory (ROM), a random-access memory (RAM), an electronically erasable programmable read-only memory (EEPROM), a flash memory, etc., and may run operating systems and applications. In the embodiment, the chip may be applied to an electrical testing device for a motor, a power converter, or a power module.

In the embodiment shown in FIG. 1, the abnormal current monitoring device 100 may include a first detection circuit 110, a second detection circuit 120, and the control circuit 130. The first detection circuit 110 and the second detection circuit 120 are respectively coupled to the power device 200. In the embodiment, the first detection circuit 110 may be, for example, an over current detection circuit to monitor the over current of the power device 200. The second detection circuit 120 may be, for example, a leakage current detection circuit to monitor the leakage current of the power device 200.

In the embodiment, the control circuit 130 is coupled to the first detection circuit 110 and the second detection circuit 120. The control circuit 130 may receive data or signals (for example, a parameter S1 and a signal S2) respectively detected by the first detection circuit 110 and the second detection circuit 120, and perform a determination operation on electrical abnormality accordingly. In the embodiment, the control circuit 130 may be, for example, a signal converter, a field programmable gate array (FPGA), a central processing unit (CPU), or a programmable general purpose or special purpose microprocessor, a digital signal processor (DSP), a programmable controller, an application specific integrated circuit (ASIC), a programmable logic device (PLD), or other similar devices or a combination of these devices, and may load and execute relevant firmware or software to implement the calculation and control functions.

Figure 2:
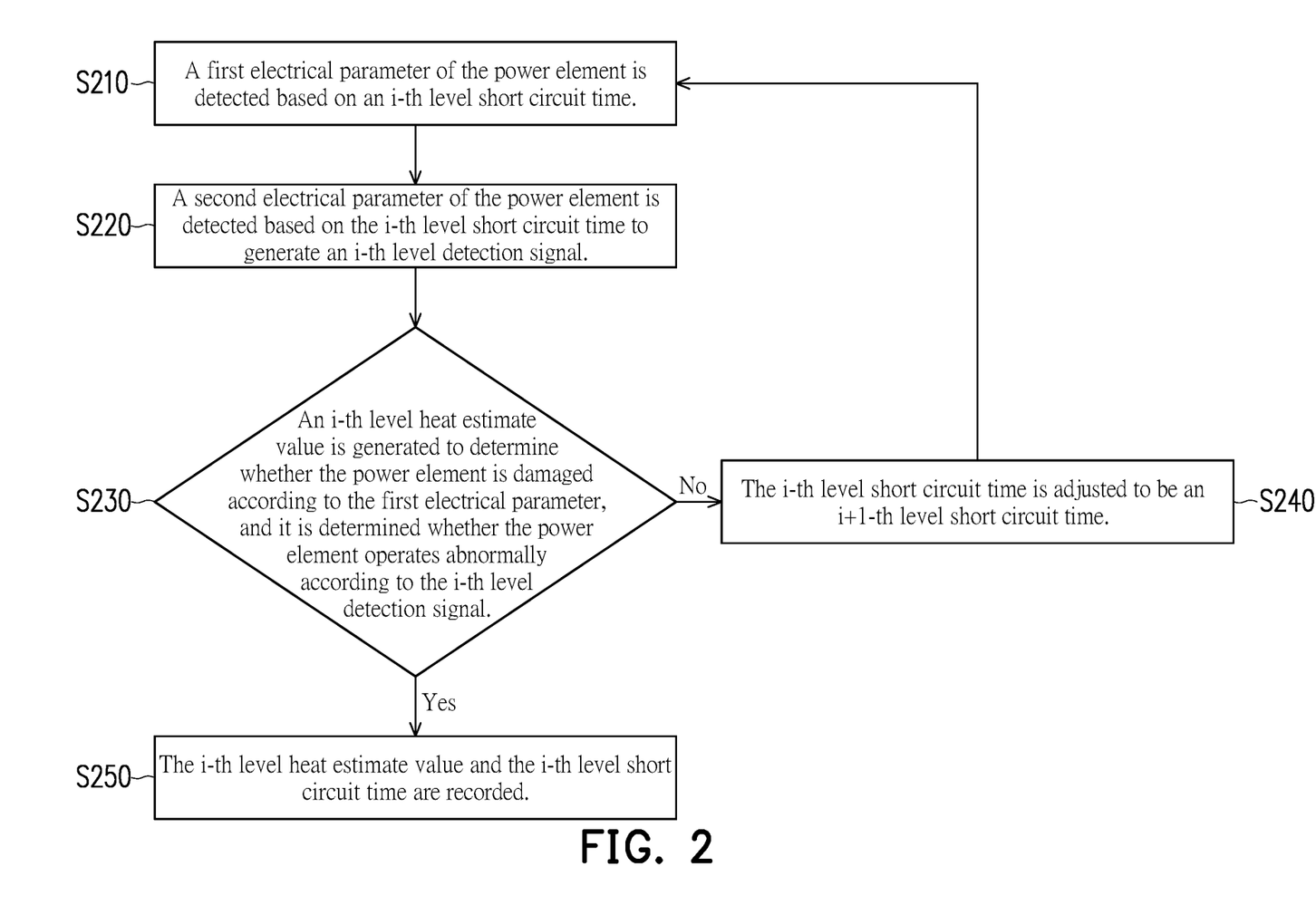
FIG. 2 is a flow chart of an abnormal current monitoring method according to an embodiment of the disclosure.

FIG. 2 is a flow chart of an abnormal current monitoring method according to an embodiment of the disclosure. Referring to FIG. 1 and FIG. 2, the abnormal current monitoring device 100 may perform the following steps S210 to S250. In the embodiment, the abnormal current monitoring device 100 may repeatedly execute steps S210 to S240 to monitor and record the electrical operation of the power device 200 in response to the different short circuit times, and stops at step S250 until the power device 200 is damaged and inoperable. The following embodiments illustrate the steps of the monitoring operation of the abnormal current monitoring device 100 at the i-th level, and take an i-th level short circuit time as an example, where i is a non-negative integer.

In step S210, the first detection circuit 110 detects a first electrical parameter S1 of the power device 200 based on the i-th level short circuit time. The first detection circuit 110 provides the first electrical parameter S1 to the control circuit 130. In the embodiment, the first electrical parameter S1 is an electrical parameter related to the over current, and may include, for example, the output current of the power device 200 (such as an output current ID shown in FIG. 3) and the output voltage (such as an output voltage VDS shown in FIG. 3).

In step S220, the second detection circuit 120 detects a second electrical parameter of the power device 200 based on the i-th level short circuit time to generate an i-th level detection signal S2. The second detection circuit 120 provides the i-th level detection signal S2 to the control circuit 130. In the embodiment, the second electrical parameter is an electrical parameter related to the leakage current, and may be, for example, a control current of the power device 200 (e.g., a control current IG shown in FIG. 3).

In step S230, the control circuit 130 generates an i-th level heat estimation value to determine whether the power device 200 is damaged according to the first electrical parameter S1. That is to say, the control circuit 130 converts the current and/or voltage detected based on the i-th level short circuit time (i.e., the first electrical parameter S1) into the heat parameter (i.e., the i-th level heat estimation value) to determine accordingly whether the over current causes damage to the power device 200.

If it is determined that the power device 200 is non-damaged, it means that the power device 200 may withstand the large current during the i-th level short circuit time, and does not have or will not have the electrical abnormality of the over current. The abnormal current monitoring device 100 executes step S240 to continue monitoring. On the contrary, if it is determined that the power device 200 is damaged, it means that the power device 200 may not withstand the corresponding large current within the i-th level short circuit time, and have or may about to have the electrical abnormality of the over current. The abnormal current monitoring device 100 executes step S250 to further monitor the health of the power device 200.

In addition, in step S230, the control circuit 130 determines whether the power device 200 is abnormal in operation according to the i-th level detection signal S2. That is to say, the control circuit 130 analyzes the current and/or voltage detected based on the i-th level short circuit time (i.e., the i-th level detection signal S2), and determines accordingly whether the leakage current is too large to make the power device 200 inoperable.

If it is determined that the power device 200 is not abnormal in operation, it means that the power device 200 is still operable even if damaged, and does not have or will not have the electrical abnormality of the leakage current, so the control circuit 130 determines that the power device 200 is not abnormal in operation. The abnormal current monitoring device 100 executes step S240. On the contrary, if it is determined that the power device 200 is abnormal in operation, it means that the power device 200 is damaged and inoperable, and have or may about to have the electrical abnormality of the leakage current, so the control circuit 130 determines that the power device 200 is abnormal in operation. The abnormal current monitoring device 100 executes step S250.

In step S240, when the power device 200 is determined to be non-damaged and not abnormal in operation, the control circuit 130 adjusts the i-th level short circuit time to be an i+1-th level short circuit time, so that the abnormal current monitoring device 100 re-execute step S210 to continue monitoring based on the i+1-th level short circuit time. That is, when the power device 200 is damaged but still operable, the abnormal current monitoring device 100 monitors the operation of the power device 200 in response to another short circuit time.

In step S250, when the power device 200 is determined to be damaged and abnormal in operation, the control circuit 130 records the i-th level heat estimation value and the i-th level short circuit time. That is to say, when the power device 200 is damaged and inoperable, the abnormal current monitoring device 100 records the electrical parameter sufficient to disable the power device 200.

It is worth mentioning here that the abnormal current monitoring device 100 may determine whether the power device 200 is damaged due to the electrical abnormality of the over current according to the multiple electrical parameters of the power device 200 (i.e., the first electrical parameter S1 and the i-th level detection signal S2), and whether there is an abnormal operation due to the electrical abnormality of the leakage current. Therefore, the abnormal current monitoring device 100 may estimate the protection triggering safety time (i.e., short circuit time) of the power device 200 in response to the over current, and may monitor the health and the electrical abnormality of the power device 200 in real time.

Figure 3:
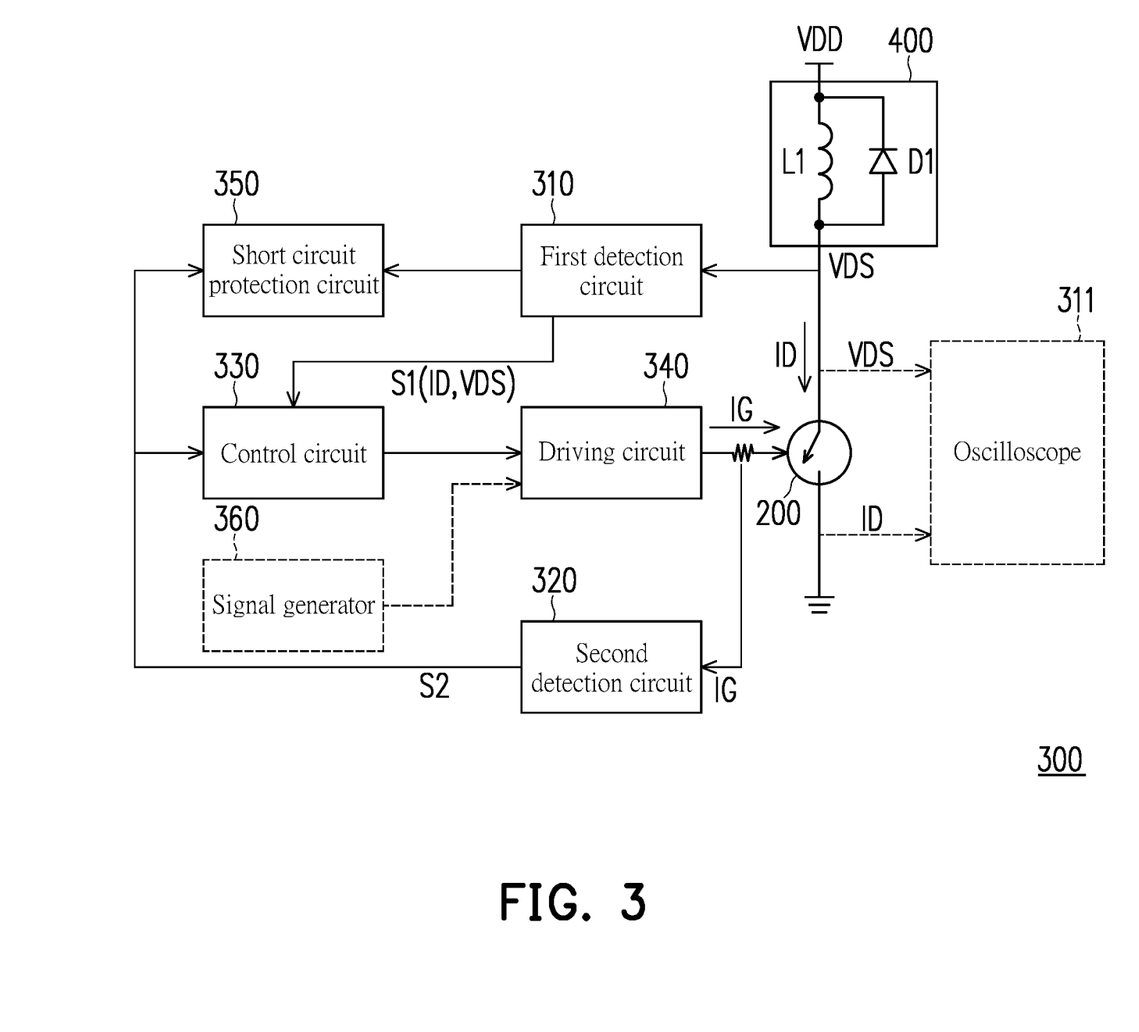
FIG. 3 is a block diagram of an abnormal current monitoring device according to an embodiment of the disclosure.

FIG. 3 is a block diagram of an abnormal current monitoring device according to an embodiment of the disclosure. Referring to FIG. 3, an abnormal current monitoring device 300 may include a first detection circuit 310, a second detection circuit 320, a control circuit 330, a driving circuit 340, and a short circuit protection circuit 350. The circuits 310 to 330 shown in FIG. 3 may be deduced by referring to the related description of the abnormal current monitoring device 100 shown in FIG. 1, and may not be repeated here. In order to facilitate the description of the content of the disclosure, the marking and description of the resistor are omitted in FIG. 3. In the embodiment, the power device 200 may be exemplified by, for example, a power switch implemented by a MOSFET. The power device 200 and an inductive load clamping circuit 400 may be connected in series between a power supply voltage VDD and a ground terminal. The inductive load clamping circuit 400 may adjust the pulse width through the control circuit 330 to control the current flowing between the drain terminal and the source terminal of the power device 200 (i.e., the output current ID). In the embodiment, the inductive load clamping circuit 400 may include a diode D1 and an inductor L1 coupled in parallel.

In the embodiment, the driving circuit 340 is coupled to the power device 200 and the control circuit 330. The driving circuit 340 may output the control current IG and a specific pulse width to the control terminal (i.e., the gate terminal) of the power device 200 according to the instruction of the control circuit 330. For example, the driving circuit 340 may generate a pulse signal with a specific pulse width (for example, the i-th level short circuit time length) and a specific voltage level as the control current IG. Therefore, the power device 200 may respond to the i-th level short circuit time to generate the output voltage VDS and the output current ID according to the pulse signal.

In the embodiment, the short circuit protection circuit 350 is coupled to the power device 200, the first detection circuit 310, and the second detection circuit 320. The short circuit protection circuit 350 may include an over current protection (OCP) circuit and an over voltage protection (OVP) circuit. The short circuit protection circuit 350 may determine whether to turn off the power device 200 according to the i-th level detection signal S2, and may cut off or not cut off the path flowing through the power device 200 within the i-th level short circuit time to protect the power device 200. In an embodiment, the short circuit protection circuit 350 may protect the power device 200 according to the first electrical parameter S1 and/or the i-th level detection signal S2.

In some embodiments, the abnormal current monitoring device 300 further includes a signal generator 360 and an oscilloscope 311. The signal generator 360 is coupled to the driving circuit 340. The signal generator 360 may generate the above-mentioned pulse signal (i.e., the control current IG), and output the pulse signal to the power device 200 through the driving circuit 340. In an embodiment, the signal generator 360 may be integrated with the driving circuit 340.

In some embodiments, the oscilloscope 311 is coupled to two terminals of the power device 200. The oscilloscope 311 may detect the output voltage VDS and the output current ID of the power device 200 to perform cooperative operation with the first detection circuit 310. In an embodiment, the oscilloscope 311 may be integrated with the first detection circuit 310.

Figure 4:
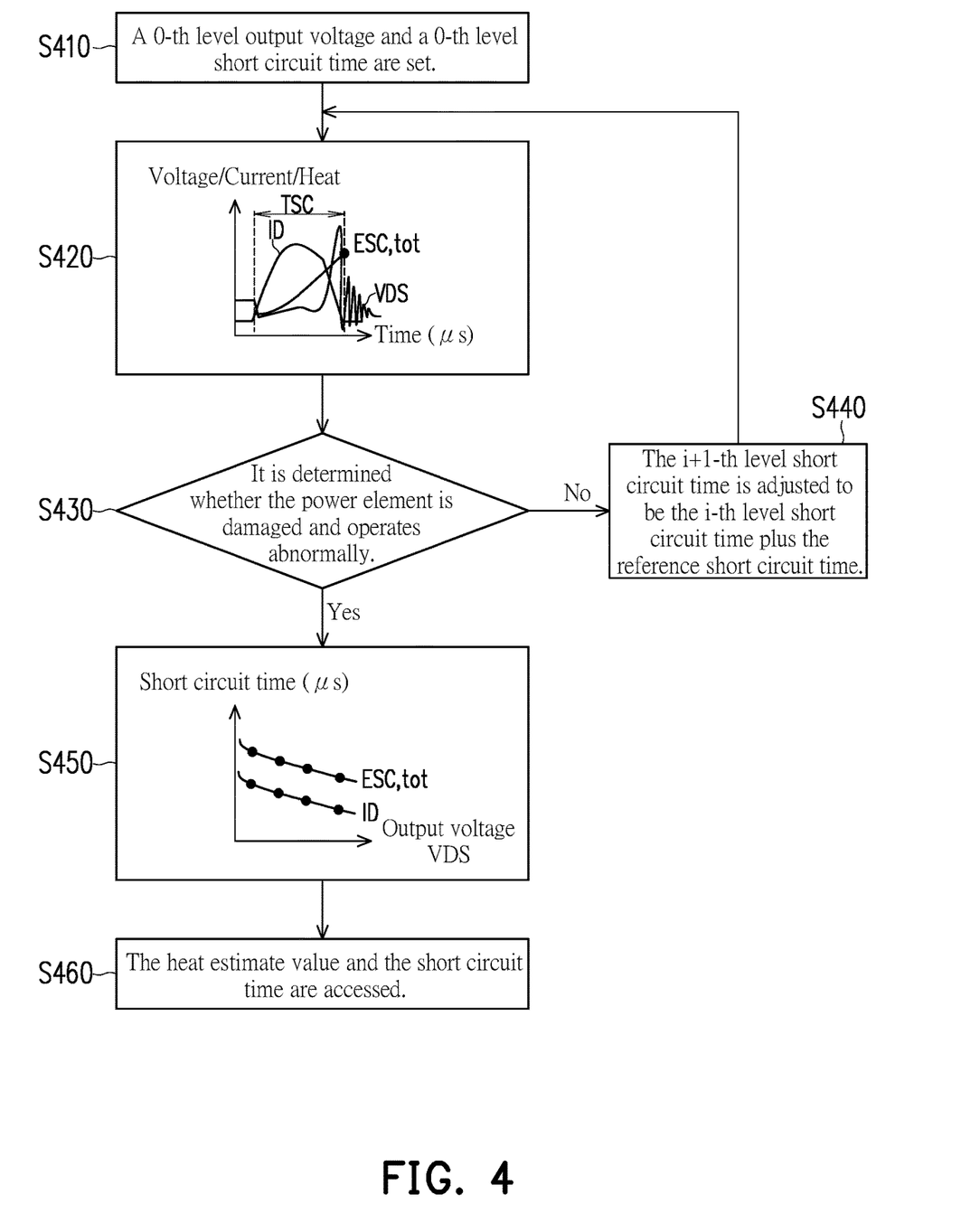
FIG. 4 is a schematic operation diagram of an abnormal current monitoring method according to an embodiment of the disclosure.

FIG. 4 is a schematic operation diagram of an abnormal current monitoring method according to an embodiment of the disclosure. Referring to FIG. 3 and FIG. 4, the abnormal current monitoring device 300 may execute the following modules S410 to S460. In the embodiment, the abnormal current monitoring device 300 may repeatedly execute the modules S410 to S440 to monitor and record the electrical operation of the power device 200 in response to the different short circuit times, and stops at module S460 until the power device 200 is damaged and inoperable.

In module S410, the user may operate the abnormal current monitoring device 300 to set a 0-th level output voltage VDS and a 0-th level short circuit time TSC. That is to say, the user may set the initial operating parameter of the abnormal current monitoring device 300. In some embodiments, the 0-th output voltage VDS and the 0-th short circuit time TSC may be preset parameters when the abnormal current monitoring device 300 leaves the factory. The following embodiments illustrate the steps of the monitoring operation of the abnormal current monitoring device 300 at the i-th level, and take the i-th level short circuit time as an example, where i is a non-negative integer.

In module S420, the control circuit 330 receives the output current ID and the output voltage VD (i.e., the first electrical parameter S1) from the first detection circuit 310. The control circuit 330 determines whether the power device 200 is damaged according to the aforementioned parameter S1, and another implementation detail of step S230 in FIG. 2 is exemplified by an example and illustrated with a two-dimensional legend. In the legend of module S420, the horizontal axis represents the operation time of the abnormal current monitoring device 300 (the unit is microsecond (μs), for example), and the vertical axis represents the voltage value, current value, and the heat value (or energy value).

In detail, the control circuit 330 receives an i-th level heat estimation value ESC,tot generated by an integration calculation of a product of the output current ID and the output voltage VDS based on an i-th level short circuit time TSC. In the embodiment, the aforementioned integration calculation may be performed, for example, by the control circuit 330. In some embodiments, the aforementioned integration calculation may be performed, for example, by other calculation circuits. Other calculation circuits may obtain the waveform signals of the output current ID and the output voltage VDS through the oscilloscope 311 and perform the integration calculation accordingly.

In the embodiment, the aforementioned integration calculation includes the following operations. The control circuit 330 converts the output current ID and the output voltage VDS into digital data through an analog to digital converter, and performs the digital integration based on the related firmware or software. The i-th level heat estimation value ESC, tot may be implemented as shown in the following formula (1). ESC in the formula (1) is the i-th level heat estimation value ESC, tot, TSC is the i-th level short circuit time TSC, VDS is the voltage value of the output voltage VDS, ID is the current value of the output current ID, and t is the time.

$$ESC = \int_0^{TSC} VDS \cdot ID \, dt \qquad \text{formula (1)}$$

That is to say, the control circuit 330 accumulates the energy formed by the output current ID and the output voltage VDS when the power device 200 responds within the i-th level short circuit time TSC. The control circuit 330 converts the aforementioned energy into heat (i.e., the i-th level heat estimation value ESC, tot) with a preset efficiency (e.g., close to 100%).

Continuing the above description, the control circuit 330 compares the i-th level heat estimation value ESC, tot with a reference heat estimation value to determine whether the power device 200 is damaged. In the embodiment, when the i-th level heat estimation value ESC, tot is greater than the reference heat estimation value, it means that the i-th level heat estimation value ESC, tot is too large and causes the power device 200 to have or may about to have the electrical abnormality of the over current. At this time, the control circuit 330 determines that the power device 200 is damaged. The abnormal current monitoring device 300 executes module S430.

On the other hand, when the i-th level heat estimation value ESC, tot is not greater than the reference heat estimation value, it means that the i-th level heat estimation value ESC, tot is not enough to cause the power device 200 to have the electrical abnormality of the over current. At this time, the control circuit 330 determines that the power device 200 is non-damaged. The abnormal current monitoring device 300 re-executes module S420.

In the embodiment, the reference heat estimation value refers to the maximum energy that the power device 200 may withstand. When the energy applied to the power device 200 is higher than the reference heat estimation value, at least a part of the power device 200 (such as the crystal surface or the oxide layer thereof) may be damaged. In the embodiment, the reference heat estimation value is related to the size of the power device 200. The reference heat estimation value may be, for example, a unit energy previously provided by the manufacturer of the power device 200, or a parameter obtained by the experiment of the third-party manufacturer.

In module S430, the control circuit 330 determines that the power device 200 is damaged. At the same time, the second detection circuit 320 generates the i-th level detection signal S2 according to the control current IG, so that the control circuit 330 may further determine whether the power device 200 is abnormal in operation according to the i-th level detection signal S2, and another implementation detail of steps S220 and S230 in FIG. 2 is exemplified by an example.

Figure 5:
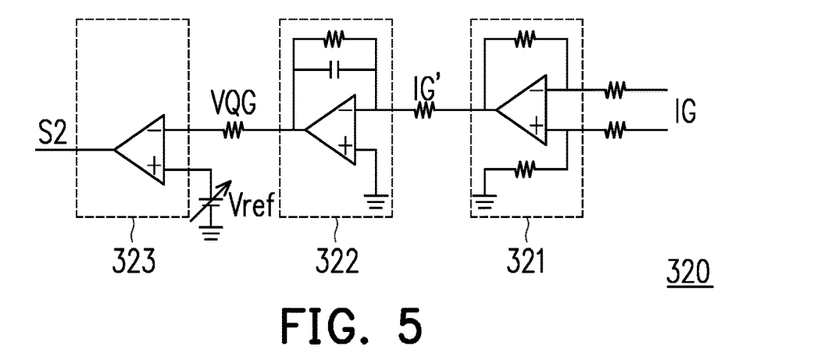
FIG. 5 is a circuit diagram of the second detection circuit shown in the embodiment of FIG. 3 according to the disclosure.

In detail, referring to FIG. 5 together, FIG. 5 is a circuit diagram of the second detection circuit shown in the embodiment of FIG. 3 according to the disclosure. In the embodiment, the second detection circuit 320 may include a differential circuit 321, an integration circuit 322, and a comparison circuit 323. A differential input terminal of the differential circuit 321 is coupled to a control terminal of the power device 200 to capture the control current IG. An inverting input terminal of the integration circuit 322 is coupled to an output terminal of the differential circuit 321.

A non-inverting input terminal of the integration circuit 322 is coupled to a ground terminal. An inverting input terminal of the comparison circuit 323 is coupled to an output terminal of the integration circuit 322. A non-inverting input terminal of the comparison circuit 323 receives a variable reference voltage Vref. An output terminal of the comparison circuit 323 is coupled to the control circuit 330 and the short circuit protection circuit 350 in FIG. 3. In order to facilitate the description of the content of the disclosure, the marking and description of the resistor and the capacitor are omitted in FIG. 5.

In the embodiment, the differential circuit 321 may be used as an operational amplifier. The differential circuit 321 may output an amplified control current IG' according to the control current IG. In the embodiment, the integration circuit 322 may be used as an integrator. The integration circuit 322 may perform an integration operation according to the amplified control current IG' to generate an i-th level detection voltage VQG. The aforementioned integration operation includes using the integration circuit 322 to accumulate the charge of the amplified control current IG'. The comparison circuit 323 may be used as a comparator. The comparison circuit 323 may compare the i-th level detection voltage VQG with the reference voltage Vref to generate the i-th level detection signal S2. In the embodiment, the i-th level detection voltage VQG may correspond to the leakage current of the power device 200. The reference voltage Vref may correspond to a reference leakage current of the power device 200.

In the embodiment, when the voltage value of the i-th level detection voltage VQG is not greater than the voltage value of the reference voltage Vref, it means that the size of the leakage current of the power device 200 is not greater than the reference leakage current. That is, even if the power device 200 is damaged due to the over current, the power device 200 is still operable. At this time, the comparison circuit 323 generates the i-th level detection signal S2 having the first value. The first value may be, for example, a low voltage reference level or a logic low level. The aforementioned i-th level detection signal S2 may indicate that the power device 200 is damaged and operable, so that the control circuit 330 determines that it is not abnormal in operation. The abnormal current monitoring device 300 executes the module S440.

On the other hand, when the voltage value of the i-th level detection voltage VQG is greater than the voltage value of the reference voltage Vref, it means that the leakage current of the power device 200 is greater than the reference leakage current. That is to say, in addition to the power device 200 being damaged due to the over current, the health of the power device 200 is low and an excessive leakage current is generated. At this time, the comparison circuit 323 generates the i-th level detection signal S2 with the second value. The second value may be, for example, a high voltage reference level or a logic high level. The aforementioned i-th level detection signal S2 may indicate that the power device 200 is damaged and inoperable, so that the control circuit 330 determines that the power device 200 is abnormal in operation. The abnormal current monitoring device 300 executes module S450.

In module S440, when the power device 200 is determined to be damaged and not abnormal in operation, the control circuit 330 lengthens the short circuit time in the next stage of monitoring operation, so as to adjust the i+1-th level short circuit time to be the i-th level short circuit time plus a reference short circuit time. The abnormal current monitoring device 300 re-executes module S420 to continue monitoring based on the i+1-th level short circuit time. In the embodiment, the reference short circuit time is related to the size of the power device 200. The reference short circuit time may be, for example, a unit time previously provided by the manufacturer of the power device 200, and may be, for example, 100 nanoseconds (ns).

In module S450, when the power device 200 is determined to be damaged and abnormal in operation, the control circuit 330 draws a table or a two-dimensional legend according to the data in the 0-th-level monitoring operation to the i-th level monitoring operation. In the legend of module S450, the horizontal axis is the voltage value of the output voltage VDS, and the vertical axis is the short circuit time TSC of the abnormal current monitoring device 300 (the unit is μs, for example).

In detail, the control circuit 330 records the heat estimation value ESC, tot and the output current ID of the power device 200 at various levels of the monitoring operations, and uses the output voltage VDS and the short circuit time TSC as variables to obtain the legend shown in module S450. Therefore, the control circuit 330 may obtain the electrical operation characteristics of the power device 200 in response to the various short circuit times TSC, such as the over current tolerance and the corresponding voltage and current values.

In the module S460, the control circuit 330 may access the data recorded in module S450 such as the table or the two-dimensional legend. The aforementioned data are, for example, heat estimation value ESC, tot and the short circuit time TSC of the power device 200 at various levels of the monitoring operations. In some embodiments, the table or the two-dimensional legend recorded in module S450 may be used as a reference for the electrical operation of the power device 200 and other devices of the same specification, so as to be applied in the protection circuit of the power device 200.

Figure 6:
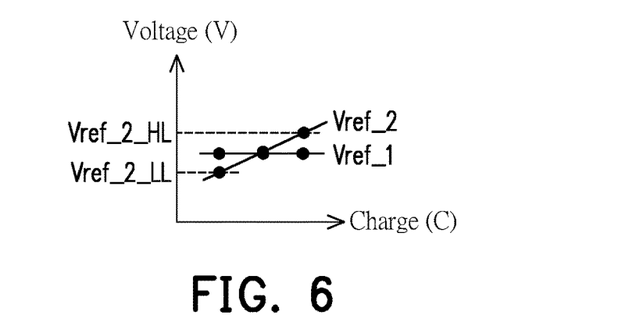
FIG. 6 is a schematic operation diagram of the second detection circuit shown in the embodiment of FIG. 5 according to the disclosure.
Figure 7:
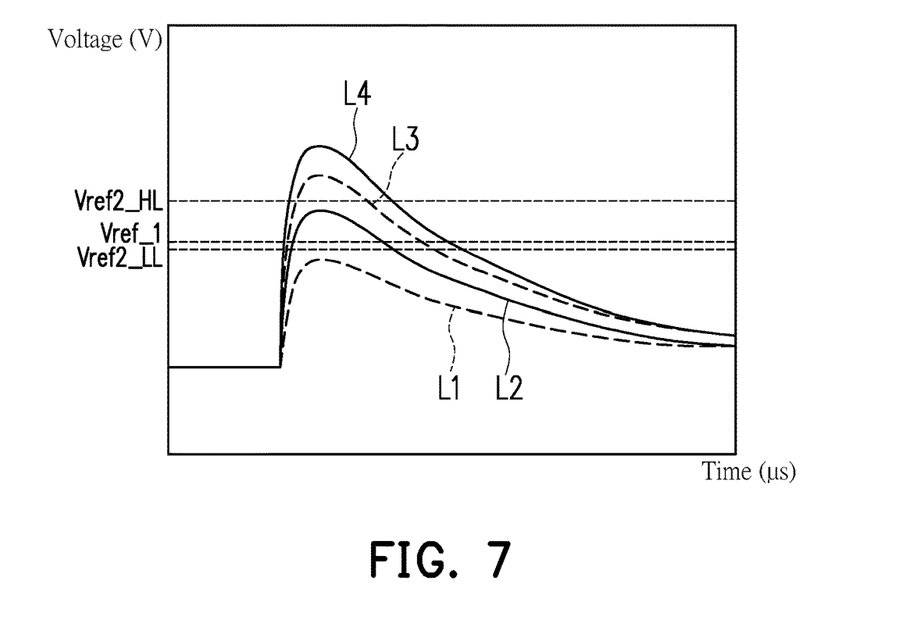
FIG. 7 is a schematic operation diagram of the second detection circuit shown in the embodiment of FIG. 5 according to the disclosure.

FIG. 6 is a schematic operation diagram of the second detection circuit shown in the embodiment of FIG. 5 according to the disclosure. In FIG. 6, the horizontal axis is the charge (in Coulomb (C) for example) on the inverting input terminal of the comparison circuit 323 (i.e., the i-th level detection voltage VQG), and the vertical axis is the voltage value. FIG. 7 is a schematic operation diagram of the second detection circuit shown in the embodiment of FIG. 5 according to the disclosure. In FIG. 7, the horizontal axis is the operation time of the second detection circuit 320 (the unit is μs, for example), and the vertical axis is the voltage value.

Referring to FIG. 5 to FIG. 7, in some conventional detection circuits, the comparison circuit performs a comparison operation according to a reference voltage Vref_1. The reference voltage Vref_1 has a fixed voltage value. Therefore, when the non-inverting input terminals of the comparison circuit have different charges, or when the comparison circuit operates at any point in time, the comparison circuit uses the same reference value as a comparison basis. However, when the power device 200 withstands different loads, the charge or voltage on the non-inverting input terminal of the comparison circuit (corresponding to the detection voltage VQG in FIG. 5) has different corresponding values, so that the comparison circuit outputs a wrong comparison result.

In the embodiment, the smaller the voltage value of the i-th level detection voltage VQG, the smaller the amount of the charge on the node, and the smaller the current value of the corresponding leakage current. The smaller the current value of the leakage current, the smaller the load withstood by the power device 200 (i.e., light load), or the smaller the voltage value of the power supply voltage VDD (e.g., 400V). On the other hand, the larger the voltage value of the i-th level detection voltage VQG, the larger the amount of the charge on the node, and the larger the current value of the corresponding leakage current. The larger the current value of the leakage current, the larger the load withstood by the power device 200 (i.e., heavy load), or the larger the voltage value of the power supply voltage VDD (e.g., 800V).

It should be noted that the second detection circuit 320 or the control circuit 330 may adjust the voltage value of the reference voltage Vref received by the non-inverting input terminal of the comparison circuit 323 according to the load of the power device 200, and the voltage value of the reference voltage Vref received by the non-inverting input terminal of the comparison circuit 323 is exemplarily shown in a reference voltage Vref_2 of FIG. 6. In FIG. 6, when the charge amount is smaller, the reference voltage Vref_2 has a first voltage value Vref2_LL as a reference value during light load. When the charge amount is larger, the reference voltage Vref_2 has a second voltage value Vref2_HL as a reference value during heavy load. The first voltage value Vref2_LL is smaller than the second voltage value Vref2_HL.

In some examples as shown in FIG. 7, assuming that the power device 200 has a light load and does not have the electrical abnormality of the leakage current, the i-th level detection voltage VQG is exemplarily shown on a line L1. Since the power device 200 has a light load, the reference voltage Vref_2 has the voltage value Vref2_LL. At this time, the voltage value of the i-th level detection voltage VQG is lower than the voltage value Vref2_LL, so the comparison circuit 323 outputs the i-th level detection signal S2 indicating that the power device 200 is damaged and operable.

Assuming that the power device 200 has a heavy load and does not have the electrical abnormality of the leakage current, the i-th level detection voltage VQG is exemplarily shown on a line L2. Since the power device 200 has a heavy load, the reference voltage Vref_2 has the voltage value Vref2_HL. At this time, the voltage value of the i-th level detection voltage VQG is lower than the voltage value Vref2_HL, so the comparison circuit 323 outputs the i-th level detection signal S2 indicating that the power device 200 is damaged and operable. It should be noted that, in the conventional detection circuit, the comparison circuit may consider that the voltage value of the detection voltage is greater than the voltage value Vref_1 and output a detection signal wrongly indicated.

Assuming that the power device 200 has a light load and has the electrical abnormality of the leakage current, the i-th level detection voltage VQG is exemplarily shown on a line L3. Since the power device 200 has a light load, the reference voltage Vref_2 has the voltage value Vref2_LL. At this time, the voltage value of the i-th level detection voltage VQG is higher than the voltage value Vref2_LL, so the comparison circuit 323 outputs the i-th level detection signal S2 indicating that the power device 200 is damaged and inoperable.

Assuming that the power device 200 has a heavy load and has the electrical abnormality of the leakage current, the i-th level detection voltage VQG is exemplarily shown on a line L4. Since the power device 200 has a heavy load, the reference voltage Vref_2 has the voltage value Vref2_HL. At this time, the voltage value of the i-th level detection voltage VQG is higher than the voltage value Vref2_HL, so the comparison circuit 323 outputs the i-th level detection signal S2 indicating that the power device 200 is damaged and inoperable.

In summary, the abnormal current monitoring device and the abnormal current monitoring method of the embodiments of the disclosure determine whether the power device is damaged due to the over current according to the output voltage, the output current, and the control current of the power device in response to the multi-level short circuit time, and determine whether the leakage current is abnormal in operation after the power device is damaged. In this way, the abnormal current monitoring device may estimate the operating characteristics of the power devices within different protection triggering safety times (i.e., short circuit time), and may also monitor the electrical operation of the power devices (i.e., health) in real time. In some embodiments, the reference voltage changes according to the load of the power device, so the comparison circuit may generate the detection signal based on the variable reference voltage, so as to improve the accuracy of the detection.

Although the disclosure has been described with reference to the embodiments above, the embodiments are not intended to limit the disclosure. Any person skilled in the art can make some changes and modifications without departing from the spirit and scope of the disclosure. Therefore, the scope of the disclosure will be defined in the appended claims.

What is claimed is:

1. An abnormal current monitoring device, suitable for a power device, comprising:
    a first detection circuit, coupled to the power device, and configured to detect a first electrical parameter of the power device based on an i-th level short circuit time;
    a second detection circuit, coupled to the power device, and configured to detect a second electrical parameter of the power device so as to generate an i-th level detection signal based on the i-th level short circuit time; and
    a control circuit, coupled to the first detection circuit and the second detection circuit, and configured to generate an i-th level heat estimation value to determine whether the power device is damaged according to the first electrical parameter and to determine whether the power device is abnormal in operation according to the i-th level detection signal,
    wherein the control circuit records the i-th level heat estimation value and the i-th level short circuit time when the power device is determined to be damaged and abnormal in operation, the control circuit adjusts the i-th level short circuit time to an i+1-th level short circuit time when the power device is determined to be non-damaged and not abnormal in operation, and an i is a non-negative integer.

2. The abnormal current monitoring device according to claim 1, wherein the first electrical parameter comprises an output current and an output voltage of the power device.

3. The abnormal current monitoring device according to claim 2, wherein the control circuit receives the i-th level heat estimation value generated by an integration calculation of a product of the output current and the output voltage based on the i-th level short circuit time.

4. The abnormal current monitoring device according to claim 1, wherein the control circuit determines that the power device is damaged when the i-th level heat estimation value is greater than a reference heat estimation value, and the reference heat estimation value is related to a size of the power device.

5. The abnormal current monitoring device according to claim 1, wherein the second electrical parameter comprises a control current of the power device.

6. The abnormal current monitoring device according to claim 5, wherein the second detection circuit comprises:
    a differential circuit, coupled to a control terminal of the power device, and configured to output an amplified control current according to the control current;
    an integration circuit, coupled to the differential circuit, and configured to perform an integration operation to generate an i-th level detection voltage according to the amplified control current; and
    a comparison circuit, coupled to the integration circuit and the control circuit, and configured to compare the i-th level detection voltage with a reference voltage to generate the i-th level detection signal.

7. The abnormal current monitoring device according to claim 6, wherein the i-th level detection signal has a first value when a voltage value of the i-th level detection voltage is not greater than a voltage value of the reference voltage so that the control circuit determines that the power device is not abnormal in operation, and the i+1-th level short circuit time is the i-th level short circuit time plus a reference short circuit time.

8. The abnormal current monitoring device according to claim 6, wherein the i-th level detection signal has a second value when a voltage value of the i-th level detection voltage is greater than a voltage value of the reference voltage so that the control circuit determines that the power device is abnormal in operation.

9. The abnormal current monitoring device according to claim 6, wherein the second detection circuit adjusts a voltage value of the reference voltage according to a load of the power device.

10. The abnormal current monitoring device according to claim 1, further comprising:
    a driving circuit, coupled to the power device and the control circuit, and configured to output a control current to a control terminal of the power device; and
    a short circuit protection circuit, coupled to the power device, the first detection circuit, and the second detection circuit, and configured to determine whether to turn off the power device according to the i-th level detection signal.

11. An abnormal current monitoring method, suitable for a power device, comprising:
    detecting a first electrical parameter of the power device through a first detection circuit based on an i-th level short circuit time;
    detecting a second electrical parameter of the power device to generate an i-th level detection signal through a second detection circuit based on the i-th level short circuit time;
    generating an i-th level heat estimation value to determine whether the power device is damaged through a control circuit according to the first electrical parameter, and determining whether the power device is abnormal in operation according to the i-th level detection signal;
    recording the i-th level heat estimation value and the i-th level short circuit time through the control circuit when the power device is determined to be damaged and abnormal in operation; and
    adjusting the i-th level short circuit time to be an i+1-th level short circuit time through the control circuit when the power device is determined to be non-damaged and not abnormal in operation, wherein an i is a non-negative integer.

12. The abnormal current monitoring method according to claim 11, wherein the first electrical parameter comprises an output current and an output voltage of the power device.

13. The abnormal current monitoring method according to claim 12, wherein the step of generating the i-th level heat estimation value to determine whether the power device is damaged according to the first electrical parameter and determining whether the power device is abnormal in operation according to the i-th level detection signal comprises:
receiving the i-th level heat estimation value generated by an integration calculation of a product of the output current and the output voltage through the control circuit based on the i-th level short circuit time.

14. The abnormal current monitoring method according to claim 11, wherein the step of generating the i-th level heat estimation value to determine whether the power device is damaged according to the first electrical parameter and determining whether the power device is abnormal in operation according to the i-th level detection signal comprises:
determining that the power device is damaged through the control circuit when the i-th level heat estimation value is greater than a reference heat estimation value, wherein the reference heat estimation value is related to a size of the power device.

15. The abnormal current monitoring method according to claim 11, wherein the second electrical parameter comprises a control current of the power device.

16. The abnormal current monitoring method according to claim 15, wherein the step of detecting the second electrical parameter of the power device to generate the i-th level detection signal based on the i-th level short circuit time comprises:
outputting an amplified control current according to the control current through a differential circuit of the second detection circuit;
performing an integration operation to generate an i-th level detection voltage according to the amplified control current through an integration circuit of the second detection circuit; and
comparing the i-th level detection voltage with a reference voltage to generate the i-th level detection signal through a comparison circuit of the second detection circuit.

17. The abnormal current monitoring method according to claim 16, wherein the step of generating the i-th level heat estimation value to determine whether the power device is damaged according to the first electrical parameter and determining whether the power device is abnormal in operation according to the i-th level detection signal comprises:
enabling the i-th level detection signal to have a first value, and determining that the power device is not abnormal in operation through the control circuit when a voltage value of the i-th level detection voltage is not greater than a voltage value of the reference voltage, wherein the i+1-th level short circuit time is the i-th level short circuit time plus a reference short circuit time.

18. The abnormal current monitoring method according to claim 16, wherein the step of generating the i-th level heat estimation value to determine whether the power device is damaged according to the first electrical parameter and determining whether the power device is abnormal in operation according to the i-th level detection signal comprises:
enabling the i-th level detection signal to have a second value, and determining that the power device is abnormal in operation through the control circuit when a voltage value of the i-th level detection voltage is greater than a voltage value of the reference voltage.

19. The abnormal current monitoring method according to claim 11, further comprising:
adjusting a voltage value of a reference voltage according to a load of the power device through the second detection circuit.

20. The abnormal current monitoring method according to claim 11, further comprising:
outputting a control current to a control terminal of the power device through a driving circuit; and
determining whether to turn off the power device according to the i-th level detection signal through a short circuit protection circuit.

* * * * *